US012787849B2

(12) United States Patent
Dezsi et al.

(10) Patent No.: US 12,787,849 B2
(45) Date of Patent: Nov. 3, 2026

(54) POWER SEMICONDUCTOR PACKAGE

(71) Applicant: Wolfspeed, Inc., Durham, NC (US)

(72) Inventors: Geza Dezsi, Durham, NC (US); Yusheng Lin, Phoenix, AZ (US)

(*) Notice: Subject to any disclaimer, the term of this patent is extended or adjusted under 35 U.S.C. 154(b) by 363 days.

(21) Appl. No.: 18/525,028

(22) Filed: Nov. 30, 2023

(65) Prior Publication Data

US 2025/0183105 A1 Jun. 5, 2025

(51) Int. Cl.
*H10W 74/10* (2026.01)
*H10W 42/80* (2026.01)
*H10W 70/40* (2026.01)

(52) U.S. Cl.
CPC .......... *H10W 74/111* (2026.01); *H10W 42/80* (2026.01); *H10W 70/481* (2026.01)

(58) Field of Classification Search
CPC .............................. H10W 74/00; H10W 42/60
See application file for complete search history.

(56) References Cited

U.S. PATENT DOCUMENTS

| | | | | |
|---|---|---|---|---|
| 2007/0052072 A1* | 3/2007 | Iwade | ................. | H10W 40/778 257/E23.092 |
| 2020/0066620 A1* | 2/2020 | Kanetake | ............ | H10W 70/658 |
| 2022/0278029 A1 | 9/2022 | Terado et al. | | |
| 2023/0260861 A1 | 8/2023 | Dezsi et al. | | |

OTHER PUBLICATIONS

Silicon Carbide Mosfet TO-247, https://web.archive.org/web/20220813001443/https://ppmpower.co.uk/products/high-power-semiconductors/low-power-semiconductor-modules/silicon-carbide-mosfet-to-247/, Aug. 13, 2022 (Year: 2022).*
Infineon Technologies AG, "CoolSiCTM 2000 V SiC Trench MOSFET: Silicon Carbide MOSFET with .XT Interconnection Technology", IMYH200R075M1H Datasheet, Rev. 1.10, Jan. 16, 2023, 16 pages.
International Search Report and Written Opinion for Application No. PCT/US2024/056789, mailed May 26, 2025, 24 pages.

* cited by examiner

*Primary Examiner* — Vincent Wall
(74) *Attorney, Agent, or Firm* — Dority & Manning, P.A.

(57) ABSTRACT

Power semiconductor packages are provided. In one example, the power semiconductor package includes one or more semiconductor die having a wide bandgap semiconductor material, a housing, and one or more electrical leads extending from the housing. The power semiconductor package further includes a creepage cutout. In one example, the power semiconductor package further includes a creepage feature.

18 Claims, 9 Drawing Sheets

POWER SEMICONDUCTOR PACKAGE

FIELD

The present disclosure relates generally to semiconductor packages.

BACKGROUND

Semiconductor devices such as transistors and diodes are ubiquitous in modern electronic devices. Wide bandgap semiconductor material systems such as gallium arsenide (GaAs), gallium nitride (GaN), and silicon carbide (SiC) are being increasingly utilized in semiconductor devices to push the boundaries of device performance in areas such as switching speed, power handling capability, and thermal conductivity. Example power semiconductor devices may include metal-oxide-semiconductor field-effect transistors (MOSFETs), insulated gate bipolar transistors (IGBTs), Schottky barrier diodes, PiN diodes, thyristors, and high electron mobility transistors (HEMTs). Packaging technology may play a large role in the performance of power semiconductor devices.

SUMMARY

Aspects and advantages of embodiments of the present disclosure will be set forth in part in the following description, or can be learned from the description, or can be learned through practice of the embodiments.

One example embodiment of the present disclosure is directed to a power semiconductor package. The power semiconductor package includes one or more semiconductor die comprising a wide bandgap semiconductor material, a housing, one or more electrical leads extending from the housing, and a non-rectangular creepage cutout in the housing.

Another example embodiment of the present disclosure is directed to a power semiconductor package. The power semiconductor package includes one or more semiconductor die comprising a wide bandgap semiconductor material, a housing, one or more electrical leads extending from the housing, and a creepage cutout in the housing. The creepage cutout includes at least four sidewall segments.

Another example embodiment of the present disclosure is directed to a power semiconductor package. The power semiconductor package includes one or more semiconductor die comprising a wide bandgap semiconductor material, a housing, one or more electrical leads extending from the housing, a thermal pad that is electrically isolated from the one or more electrical leads, a creepage cutout, and a creepage feature. The creepage feature includes a trench.

Another example embodiment of the present disclosure is directed to a power semiconductor package. The power semiconductor package includes one or more semiconductor die comprising a wide bandgap semiconductor material, a housing, one or more electrical leads extending from the housing, and a creepage cutout in the housing. The creepage cutout includes one of a T-shaped creepage cutout, a cross-shaped creepage cutout, a hexagonal creepage cutout, a triangular creepage cutout, a circular creepage cutout, an L-shaped creepage cutout, or a curved creepage cutout.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

Figure 1:
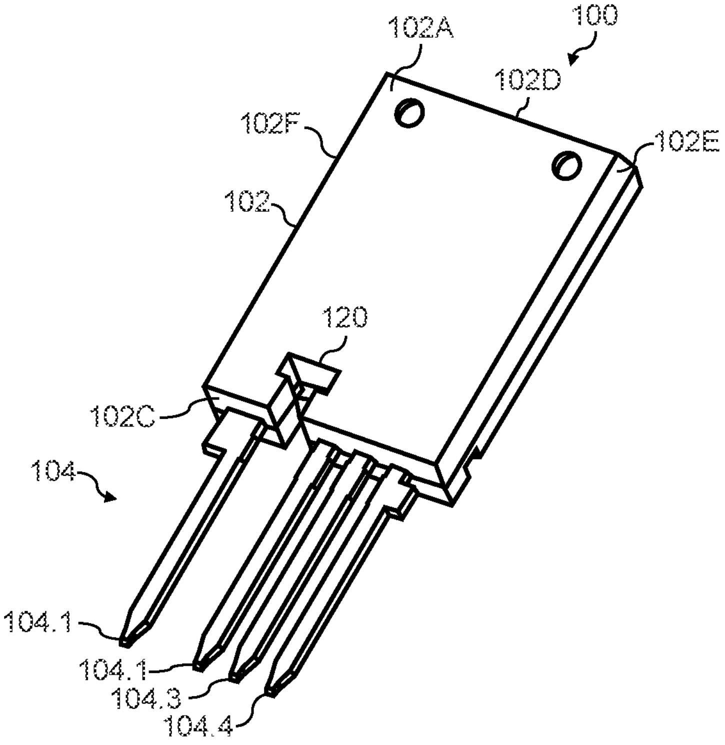
FIG. 1 depicts a top perspective view of an example power semiconductor package according to example embodiments of the present disclosure.

Repeat use of reference characters in the present specification and drawings is intended to represent the same and/or analogous features or elements of the present invention.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations may be made to the embodiments without departing from the scope or spirit of the present disclosure. For instance, features illustrated or described as part of one embodiment may be used with another embodiment to yield a still further embodiment. Thus, it is intended that aspects of the present disclosure cover such modifications and variations.

Discrete semiconductor packages have been developed that include a semiconductor die, such as a metal-oxide-semiconductor field-effect transistor (MOSFET) or a Schottky diode. Such semiconductor packages with MOSFETs may be employed in a variety of applications to enable higher switching frequencies along with reduced associated losses, higher blocking voltages, and improved avalanche capabilities. Example applications may include high performance industrial power supplies, server/telecom power, electric vehicle charging systems, energy storage systems, uninterruptible power supplies, high-voltage DC/DC converters, electric vehicles, and battery management systems. Discrete semiconductor packages with Schottky diodes may be employed in many of the same high-performance power applications described above for MOSFETs, sometimes in systems that also include discrete power packages of MOSFETs.

Example aspects of the present disclosure are directed to semiconductor packages (e.g., discrete semiconductor packages and power modules) for use in semiconductor applications and other electronic applications. In some embodiments, semiconductor packages may include one or more semiconductor die. The one or more semiconductor die may include a wide bandgap semiconductor material. A wide bandgap semiconductor has a band gap greater than about 1.40 eV, such as silicon carbide and/or a Group-III nitride (e.g., gallium nitride).

In some examples, the one or more semiconductor die may include one or more semiconductor devices, such as transistors, diodes, and/or thyristors. For instance, in some examples, the one or more semiconductor die may include a MOSFET, such as a silicon carbide-based MOSFET, located between a first (e.g., source) lead and a second (e.g., drain) lead of the power semiconductor package to form, for instance, a vertical structure power semiconductor device. Additionally and/or alternatively, in some examples, the one or more semiconductor die may include a Schottky diode, such as a silicon carbide-based Schottky diode, located between the first lead and the second lead of the power semiconductor package. Additionally and/or alternatively, in some examples, the power semiconductor package may include a high electron mobility transistor (HEMT), such as a Group-III nitride-based HEMT.

It should be understood that aspects of the present disclosure are discussed with reference to silicon carbide-based MOSFET devices for purposes of illustration and discussion. Those having ordinary skill in the art, using the disclosures provided herein, will understand that the power semiconductor package of the present disclosure may include other power semiconductor devices without deviating from the scope of the present disclosure, such as diodes (e.g., Schottky diodes, PiN diodes, etc.), insulated gate bipolar transistors, HEMTs, or other devices.

The power semiconductor package may further include a housing (e.g., epoxy mold compound) in which the one or more semiconductor die may be disposed. Packaging technology for semiconductor devices plays an important role in defining the performance of the semiconductor devices. For example, the packaging of a power semiconductor package may limit the ability of the one or more semiconductor die to dissipate heat, conduct current, or even switch at particular speeds (e.g., due to stray inductance). Ineffective heat dissipation can create problems for semiconductor devices (e.g., small form factor semiconductor devices) or in situations where the semiconductor device comes into close contact with the housing. Excessive heat can adversely impact the operation of the semiconductor device itself, as well as the electronic system that uses that semiconductor device.

The packaging of a power semiconductor die may also affect clearance and creepage of the semiconductor device. More particularly, clearance (or "clearance distance") is the shortest direct path through air between conductors at different voltage potentials. Adequate clearance distances are vital to preventing an ionization of an air gap of the semiconductor device because a breakdown along a clearance path can happen instantaneously under certain operating conditions.

Similarly, creepage (or "creepage distance") is the shortest direct path along a surface between conductors at different voltage potentials. As such, the packaging of the power semiconductor device plays an important role in determining the creepage distance of the power semiconductor device. Creepage may occur in situations where charge carriers are influenced by, for instance, electric fields, temperature gradients, and/or other factors that cause the charge carriers to drift along the surface of the semiconductor device. Depending on the packaging and operating conditions of the semiconductor device, creepage may contribute to leakage currents and/or other non-ideal behaviors in the semiconductor device. Thus, creepage distances are an important design consideration to ensure proper insulation and to prevent electrical breakdown, especially in high-voltage applications that require increased creepage distances.

Accordingly, to reduce the adverse performance-related effects associated with creepage discussed above, example aspects of the present disclosure are directed to semiconductor packages (e.g., power semiconductor packages) having a housing that provides increased creepage distance between conductors. More particularly, the power semiconductor package according to the present disclosure may include a housing (e.g., epoxy mold compound (EMC)) having one or more electrical leads extending therefrom. Furthermore, the power semiconductor package may further include a creepage cutout in the housing and/or a creepage feature. As will be discussed in greater detail below, the creepage cutout and the creepage feature may provide the power semiconductor package with increased creepage distance(s), thereby reducing the adverse performance-related effects discussed above and increasing the current and voltage handling capabilities of the power semiconductor package.

For instance, in some examples, a first lead of the power semiconductor package may be connected to a source contact of the one or more semiconductor die, and a second lead of the power semiconductor package may be connected to a drain contact of the one or more semiconductor die. In such examples, the power semiconductor package may include a creepage cutout between the first lead and the second lead to provide an increased creepage distance (e.g., in a range of about 10 mm to about 15 mm) between the first lead and the second lead. As such, the creepage cutout may effectively increase a surface distance (e.g., creepage distance) along the housing of the power semiconductor package between the first lead and the second lead. In this way, the creepage cutout may increase voltage isolation between the one or more electrical leads of the power semiconductor package.

As will be discussed in greater detail below, the creepage cutout may be a non-rectangular creepage cutout having one or more sidewall segments. For instance, by way of example, the creepage cutout may be a circular creepage cutout having one sidewall segment. In some examples, the creepage cutout may be a triangular creepage cutout having at least two segments. In some examples, the creepage cutout may be an L-shaped creepage cutout having at least five sidewall segments. In some examples, the creepage cutout may be a T-shaped creepage cutout having seven sidewall segments. In some examples, the creepage cutout may be a hexagonal creepage cutout having seven sidewall segments. In some examples, the creepage cutout may be a cross-shaped creepage cutout having eleven sidewall segments.

The power semiconductor package according to the present disclosure may further include a thermal pad that provides for cooling of the semiconductor package (e.g., top-side cooling). More particularly, the thermal pad may be electrically isolated from the one or more electrical leads. For instance, in some examples, the thermal pad may be coupled to a drain contact of the one or more semiconductor die. Furthermore, the thermal pad may also be electrically isolated from the one or more semiconductor die. For instance, in some examples, the thermal pad may be on an insulating layer of a mounting substrate of the one or more semiconductor die. Furthermore, in some examples, the power semiconductor package may include an electrically insulating plate (e.g., direct-bonded copper plate) arranged on the thermal pad.

As noted above, a power semiconductor package according to the present disclosure may also include a creepage feature that defines, for instance, a step structure and/or a trench in the housing. More particularly, the housing of the power semiconductor package may include a first surface and an adjacent (e.g., perpendicular) second surface. In some examples, the creepage cutout and the one or more electrical leads may be on the first surface of the housing. Additionally, the thermal pad and the creepage feature may be on the second surface of the housing. For instance, in some examples, the creepage feature may be disposed on the second surface such that the creepage feature is between the thermal pad and the one or more electrical leads extending from the adjacent first surface of the housing, thereby providing the power semiconductor package with increased creepage distance between the thermal pad and the one or more electrical leads. In this way, the creepage feature may increase voltage isolation between the thermal pad and the one or more electrical leads of the power semiconductor package.

Aspects of the present disclosure provide a number of technical effects and benefits. For instance, a power semiconductor package according to the present disclosure may provide efficient thermal dissipation through a thermal pad and may also provide multiple pin-out options for the one or more electrical leads. Furthermore, a power semiconductor package having a creepage extension structure according to the present disclosure, such as a creepage cutout and/or a creepage feature, may provide a high voltage rating and/or a high current rating due to the increased creepage distance resulting from the creepage extension structure. As such, the creepage cutout and creepage feature ensure proper insulation and reduce electrical breakdown in high-voltage semiconductor devices. In this way, example aspects of the present disclosure provide increased current and voltage capabilities for semiconductor packages, such as discrete power semiconductor packages, thereby providing for increased reliability and longevity of high-voltage semiconductor devices.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to silicon carbide-based semiconductor structures, such as silicon carbide-based MOSFETs. Those of ordinary skill in the art, using the disclosures provided herein, will understand that the power semiconductor packages according to example embodiments of the present disclosure may be used with any semiconductor material, such as other wide band gap semiconductor materials, without deviating from the scope of the present disclosure. Example wide band gap semiconductor materials include silicon carbide (e.g., 2.996 eV band gap for alpha silicon carbide at room temperature) and the Group III-nitrides (e.g., 3.36 eV band gap for gallium nitride at room temperature).

In the drawings and specification, there have been disclosed typical embodiments and, although specific terms are employed, they are used in a generic and descriptive sense only and not for purposes of limitation of the scope set forth in the following claims.

Figure 2:
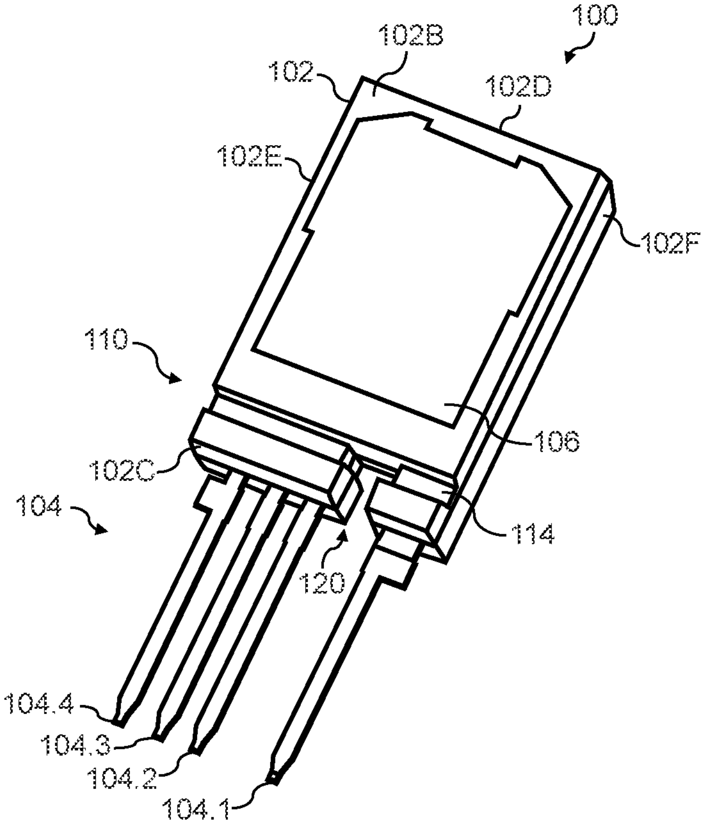
FIG. 2 depicts a bottom perspective view of the example power semiconductor package of FIG. 1 according to example embodiments of the present disclosure.

FIG. 1 depicts a top perspective view of an example power semiconductor package 100 according to example embodiments of the present disclosure. FIG. 2 depicts a bottom perspective view of the example power semiconductor package 100 according to example embodiments of the present disclosure. With reference to FIGS. 1 and 2, the power semiconductor package 100 includes a housing 102. The housing 102 may be formed by a molding process. The housing 102 may include a material capable of high temperature operation, such as a temperature of about 200° C. Example materials for the housing 102 may include an epoxy material or an epoxy mold compound (EMC).

The housing 102 may include one or more surfaces. For instance, the housing 102 may include a top surface 102A (hereinafter "surface 102A") and an opposing bottom surface 102B (hereinafter "surface 102B"). The housing 102 may further include one or more side surfaces adjacent to the surface 102A and the surface 102B. For instance, the housing 102 may include side surface 102C (hereinafter "surface 102C"), side surface 102D (hereinafter "surface 102D"), side surface 102E (hereinafter "surface 102E"), and side surface 102F (hereinafter "surface 102F"). As shown, surface 102C may be opposite surface 102D, and surface 102E may be opposite surface 102F. Furthermore, surfaces 102C and 102D may be generally perpendicular to surfaces 102E and 102F. It should be understood that the housing 102 may include different arrangements of surfaces. For instance, one or more notches or recesses may be formed on any of the surfaces 102A-102F without deviating from the scope of the present disclosure.

The power semiconductor package 100 may be arranged to house and provide external connections to one or more semiconductor die that are disposed within the housing 102. More particularly, as shown, the power semiconductor package 100 may include one or more electrical leads 104 extending from a surface of the housing 102, such as, for instance, surface 102C. Put differently, the one or more electrical leads 104 may be partially encapsulated by the housing 102 such that a portion of each of the one or more electrical leads 104 is exposed through the surface 102C. For instance, as shown, the one or more electrical leads 104 may extend in a generally perpendicular direction from surface 102C of the housing 102.

The one or more electrical leads 104 may have the form of electrical connection pins. For instance, a first lead (e.g., lead 104.2) of the one or more electrical leads 104 may be connected to a source contact of the one or more semiconductor die disposed within the housing 102, and a second lead (e.g., lead 104.1) may be connected to a drain contact of the one or more semiconductor die disposed within the housing 102. In this way, the one or more electrical leads 104 may be used to connect internal components of the power semiconductor package 100 to external electrical connections. It should be understood that, although the power semiconductor package 100 is depicted with four electrical leads 104, the power semiconductor package 100 may include more, or fewer, electrical leads 104 without deviating from the scope of the present disclosure.

The one or more semiconductor die disposed within the housing 102 may include a wide bandgap semiconductor material, such as silicon carbide or a Group-III nitride (e.g., gallium nitride). Furthermore, the one or more semiconductor die disposed within the housing 102 may also include one or more semiconductor devices, such as metal-oxide-semiconductor field-effect transistor (MOSFET) devices, Schottky diodes, and/or other devices.

For instance, in some implementations, the one or more semiconductor die may include a silicon carbide-based MOSFET. In such implementations, a first lead of the one or more electrical leads 104 may be connected to a gate contact of the MOSFET, a second lead of the one or more electrical leads 104 may be connected to a source contact of the MOSFET, a third lead of the one or more electrical leads 104 may be connected to a source-kelvin contact of the MOSFET, and a fourth lead of the one or more electrical leads 104 may be connected to a drain contact of the MOSFET.

Aspects of the present disclosure are discussed with reference to silicon carbide-based MOSFET devices for purposes of illustration and discussion. Those having ordinary skill in the art, using the disclosures provided herein, will understand that the power semiconductor die may include other power semiconductor devices without deviating from the scope of the present disclosure, such as diodes (e.g., Schottky diodes, PiN diodes, etc.), insulated gate bipolar transistors, high electron mobility transistors (HEMTs), or other devices. For instance, in some implementations, the one or more semiconductor die disposed within the housing 102 may include a silicon-carbide based Schottky diode. Additionally and/or alternatively, in some implementations, the one or more semiconductor die disposed within the housing 102 may include a Group-III nitride-based HEMT.

In the example of the one or more semiconductor die including a silicon carbide-based MOSFET, the one or more electrical leads 104 may include a first lead 104.1 (hereinafter "lead 104.1"), a second lead 104.2 (hereinafter "lead 104.2"), a third lead 104.3 (hereinafter "lead 104.3"), and a fourth lead 104.4 (hereinafter "lead 104.4"). As noted above, more or fewer electrical leads 104 may be included in the power semiconductor package 100 without deviating from the scope of the present disclosure.

More particularly, the lead 104.1 may include an electrical connection pin (e.g., a single electrical connection pin). The lead 104.1 may be coupled to a drain contact of the MOSFET on the one or more semiconductor die using, for instance, a wire bond. In this way, the lead 104.1 may be used to connect the drain of the MOSFET on the one or more semiconductor die to one or more external connections.

The lead 104.2 may include an electrical connection pin (e.g., a single electrical connection pin). The lead 104.2 may be coupled to a source contact of the MOSFET on the one or more semiconductor die using, for instance, a wire bond. In this way, the lead 104.2 may be used to connect the source of the MOSFET on the one or more semiconductor die to one or more external connections.

The lead 104.3 may include an electrical connection pin (e.g., a single electrical connection pin). The lead 104.3 may be coupled to a source-Kelvin contact of the MOSFET on the one or more semiconductor die using, for instance, a wire bond. Additionally and/or alternatively, the lead 104.3 may be coupled to a sensor contact of the MOSFET on the one or more semiconductor die using, for instance, a wire bond. In this way, the lead 104.3 may be used to connect the source-Kelvin and/or sensor contact of the MOSFET on the one or more semiconductor die to one or more external connections.

The lead 104.4 may include an electrical connection pin (e.g., a single electrical connection pin). The lead 104.4 may be coupled to a gate contact of the MOSFET on the one or more semiconductor die using, for instance, a wire bond. In this way, the lead 104.4 may be used to connect the gate of the MOSFET on the one or more semiconductor die to one or more external connections.

As discussed above, the power semiconductor package 100 may include one or more semiconductor die disposed within the housing 102 having other types of semiconductor devices without deviating from the scope of the present disclosure. For instance, in some implementations, the one or more semiconductor die may include a silicon carbide-based Schottky diode. In such implementations, one or more of the electrical leads 104 may be coupled to a first contact of the Schottky diode on the one or more semiconductor die using, for instance, wire bonds. Similarly, one or more of the electrical leads 104 may be coupled to a second contact of the Schottky diode on the one or more semiconductor die using, for instance, wire bonds.

Additionally, as shown in FIG. 2, the power semiconductor package 100 may also include a thermal pad 106 on a surface (e.g., surface 102B) of the housing 102 that is electrically isolated from the one or more electrical leads 104. The thermal pad 106 may include a thermally conductive material, such as a metal, and may be coupled to an external heat sink (e.g., with an electrical isolator) to provide topside cooling for the power semiconductor package 100. Additionally, the thermal pad 106 may be coupled to a drain contact of the one or more semiconductor die disposed within the housing 102.

Furthermore, in some implementations, the thermal pad 106 may be electrically isolated from the one or more semiconductor die disposed within the housing 102. For instance, the one or more semiconductor die disposed within the housing 102 may be mounted on a mounting substrate (e.g., conductive lead frame) of the power semiconductor package 100 (e.g., using a die-attach material). The mounting substrate may be coupled to, or integral with, the thermal pad 106. More particularly, the mounting substrate may include an insulating layer. In such implementations, the thermal pad 106 may be mounted on the insulating layer of the mounting substrate. In this manner, the thermal pad 106 may be electrically isolated from the one or more semiconductor die disposed within the housing 102.

The power semiconductor package 100 may also include a creepage feature 110 on the housing 102 and a creepage cutout 120 in the housing 102. More particularly, as will be discussed in greater detail below, the power semiconductor package 100 may include the creepage feature 110 between the thermal pad 106 and the one or more electrical leads 104. The power semiconductor package 100 may also include the creepage cutout 120 between a first lead (e.g., source lead) and a second lead (e.g., drain lead) of the one or more electrical leads 104. For instance, as shown in FIG. 2, the creepage cutout 120 may be on the surface 102C of the housing 102 between lead 104.2 and lead 104.1, and the creepage feature 110 may be on the adjacent surface 102B of the housing 102 between the thermal pad 106 and the one or more electrical leads 104. In this manner, the creepage cutout 120 may increase a creepage distance 122 (FIG. 3B) between the lead 104.2 and the lead 104.1, and the creepage feature 110 may increase a creepage distance 112 (FIG. 3A) between the thermal pad 106 and the one or more electrical leads 104.

Figure 3A:
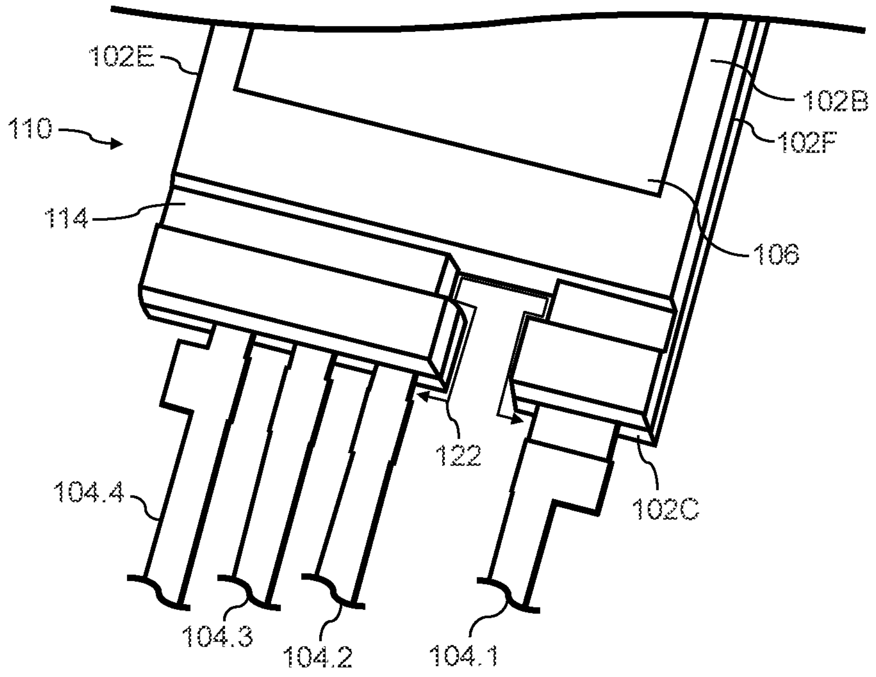
FIG. 3A depicts a close perspective view of an example creepage cutout of the power semiconductor package of FIGS. 1-2 according to example embodiments of the present disclosure.

Referring briefly to FIG. 3A, a close perspective view of the example creepage cutout 120 of the power semiconductor package 100 is depicted according to example embodiments of the present disclosure. As noted above, creepage (or "creepage distance") is the shortest direct path along a surface between conductors at different voltage potentials. In the example shown in FIG. 3A, the creepage cutout 120 provides a creepage distance 122 (e.g., about 10 mm to about 15 mm) along surface 102C of the housing 102. In this manner, the creepage cutout 120 increases the shortest direct path (e.g., creepage distance 122) between the lead 104.1 and the lead 104.2.

Figure 3B:
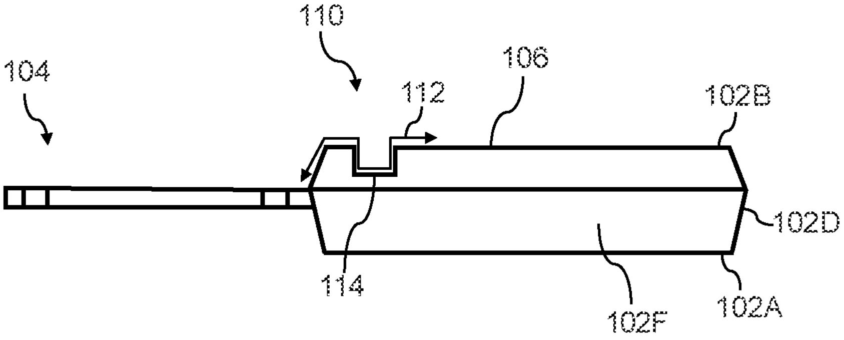
FIG. 3B depicts a close perspective view of an example creepage feature of the power semiconductor package of FIGS. 1-2 according to example embodiments of the present disclosure.

Similarly, referring briefly to FIG. 3B, a close perspective view of the example creepage feature 110 of the power semiconductor package 100 is depicted according to example embodiments of the present disclosure. In the example shown in FIG. 3B, the creepage feature 110 provides a creepage distance 112 along surface 102B of the housing 102. In this manner, the creepage feature 110 increases the shortest direct path (e.g., creepage distance 112) between the thermal pad 106 and the one or more electrical leads 104.

Referring again to FIGS. 1-2, as shown, the creepage feature 110 may define a trench 114 in the surface 102B of the housing 102. For instance, as shown, the trench 114 may be defined between the thermal pad 106 on surface 102B of the housing 102 and the one or more electrical leads 104 extending from surface 102C of the housing 102. For instance, in some implementations, the trench 114 may have a depth of about 0.5 mm to about 2.0 mm which may, in turn, increase the shortest direct path (e.g., creepage distance 112 (FIG. 3B)) along the surface 102B between the thermal pad 106 and the one or more electrical leads 104. Although depicted as defining the trench 114 in FIGS. 1-3B, the creepage feature 110 may, in some implementations, define a step structure in the housing 102. Creepage features defining one or more step structures in the housing 102 are discussed in greater detail below with reference to FIGS. 4-17.

Furthermore, in some implementations (such as FIGS. 1-2), the trench 114 laterally extends across the entire surface 102B (e.g., from surface 102E to surface 102F). Additionally and/or alternatively, in some implementations, the trench 114 may laterally extend across only a portion of the surface 102B. Furthermore, although only one trench 114 is depicted, example power semiconductor packages according to the present disclosure may include any number of trenches without deviating from the scope of the present disclosure.

Figure 4:
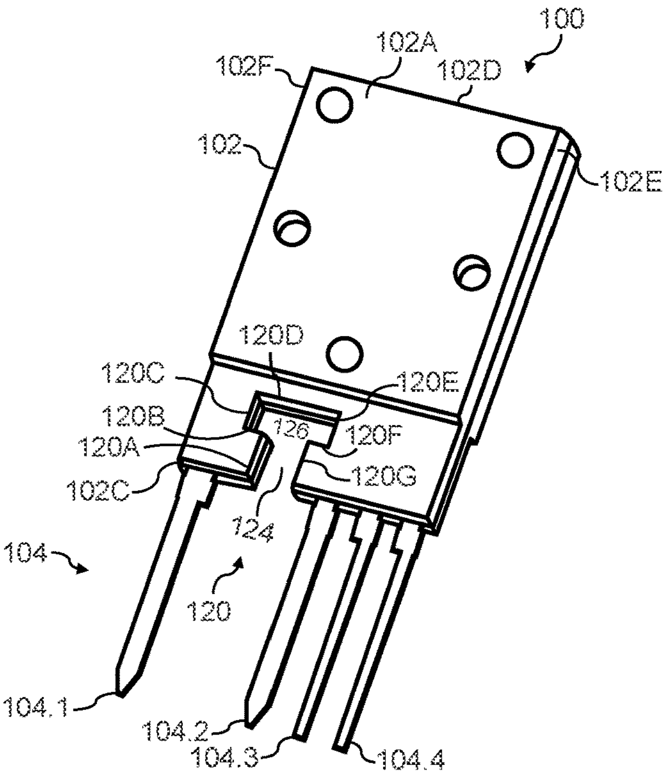
FIG. 4 depicts a top perspective view of an example power semiconductor package according to example embodiments of the present disclosure.
Figure 5:
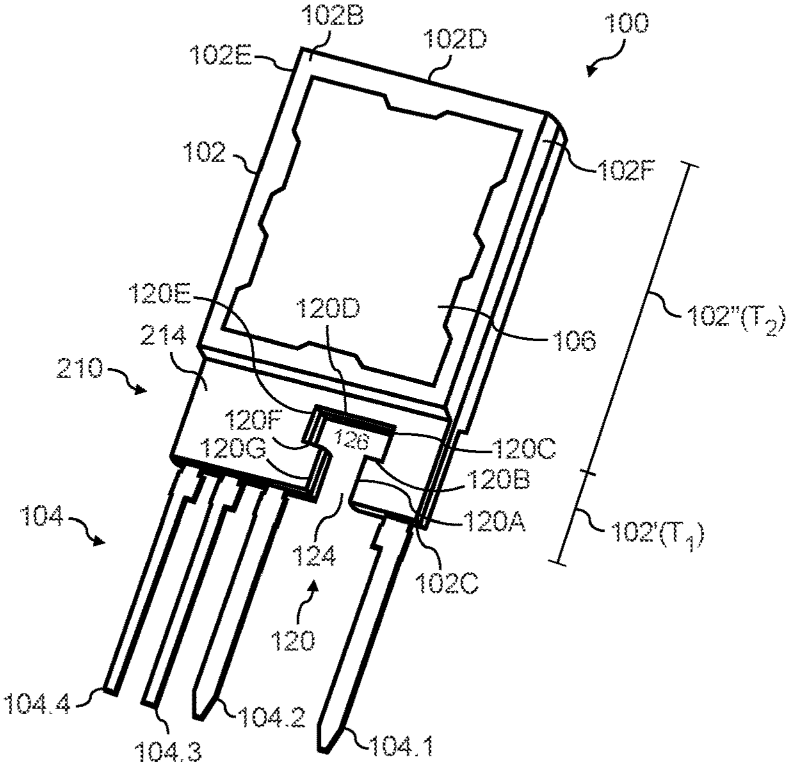
FIG. 5 depicts a bottom perspective view of the example power semiconductor package of FIG. 4 according to example embodiments of the present disclosure.

Referring still to FIGS. 1-2, as shown, the creepage cutout 120 may, in some implementations, be a T-shaped creepage cutout 120 having at least seven sidewall segments 120A-120G (FIGS. 4-5). The T-shaped creepage cutout 120 is discussed in greater detail below with reference to FIGS. 4-5. Furthermore, although depicted as a T-shaped creepage cutout 120 in FIGS. 1-3B, creepage cutouts according to the present disclosure may have a number of different shapes without deviating from the scope of the present disclosure. For instance, by way of non-limiting example, the power semiconductor package 100 may include one of a cross-shaped creepage cutout having at least eleven sidewall segments (e.g., FIGS. 6-7), a hexagonal creepage cutout having at least seven sidewall segments (e.g., FIGS. 8-9), a triangular creepage cutout having at least two sidewall segments (e.g., FIGS. 10-11), a circular creepage cutout having at least one sidewall segment (e.g., FIGS. 12-13), an L-shaped creepage cutout having at least five sidewall segments (e.g., FIGS. 14-15), or a curved creepage cutout having at least one curved sidewall segment (e.g., FIGS. 16-17). Those having ordinary skill in the art, using the disclosures provided herein, will appreciate that the creepage cutout may be any suitable non-rectangular shape having any suitable number of sidewall segments without deviating from the scope of the present disclosure.

Variations and modifications may be made to the example power semiconductor package 100 described herein without deviating from the scope of the present disclosure. For instance, the power semiconductor package 100 may include one or more creepage features 110 defining any suitable structure in the housing 102 operable to provide increased creepage distance between two or more conductors of the power semiconductor package 100 (e.g., thermal pad 106 and the one or more electrical leads 104), one or more creepage cutouts 120 having any suitable number of sidewall segments and operable to provide increased creepage distance between two or more conductors of the power semiconductor package 100 (e.g., the one or more electrical leads 104), and/or any combination thereof.

For instance, FIGS. 4-5 depict the example power semiconductor package 100 discussed above with reference to FIGS. 1-3B with a different creepage feature according to example embodiments of the present disclosure. More particularly, FIG. 4 depicts a top perspective view of the example power semiconductor package 100 having the creepage cutout 120. FIG. 5 depicts a bottom perspective view of the example power semiconductor package 100 having a creepage feature 210 and the creepage cutout 120.

As noted above, in some implementations, the creepage cutout 120 may be a T-shaped creepage cutout 120 in the housing 102. The creepage cutout 120 may be disposed between a first lead of the one or more electrical leads 104 (e.g., lead 104.2) and a second lead of the one or more electrical leads 104 (e.g., lead 104.1). The creepage cutout 120 may include at least seven sidewall segments 120A-120G. In this way, the creepage cutout 120 may provide the creepage distance 122 along surface 102C of the housing 102 (e.g., along sidewall segments 120A-120G between leads 104.1, 104.2). Furthermore, the creepage cutout 120 may include a first cutout portion 124 defined by sidewall segments 120A, 120G. The creepage cutout 120 may also include a second cutout portion 126 defined by sidewall segments 120B, 120C, 120D, 120E, 120F. More particularly, as shown, the first cutout portion 124 of the creepage cutout 120 may extend from the surface 102C towards a center of the housing 102 (e.g., towards surface 102D), and the second cutout portion 126 of the creepage cutout 120 may extend laterally between surface 102E and surface 102F of the housing. Put differently, the first cutout portion 124 may extend from the one or more electrical leads 104 on surface 102C towards a center of the second cutout portion 126, and the second cutout portion 126 may extend laterally from a peripheral end of the first cutout portion 124 towards surfaces 102E, 102F. Thus, the second cutout portion 126 may be generally perpendicular to the first cutout portion 124. In this manner, as shown, the creepage cutout 120 may increase the shortest direct path (e.g., creepage distance 122) between the lead 104.1 and the lead 104.2.

Referring now to FIG. 5, the creepage feature 210 on the housing 102 of the power semiconductor package 100 is depicted according to example embodiments of the present disclosure. As noted above, the creepage feature 210 is different than the creepage feature 110 discussed above with reference to FIGS. 1-3B. More particularly, similar to the creepage feature 110, the creepage feature 210 may be on the surface 102B of the housing 102 between the thermal pad 106 and the one or more electrical leads 104. However, instead of defining a trench (e.g., trench 114 defined by creepage feature 110), the creepage feature 210 may define a step structure 214 in the housing 102. In some implementations, the step structure 214 may have a depth of about 0.5 mm to about 2.0 mm which may, in turn, increase the shortest direct path (e.g., creepage distance) along the surface 102B between the thermal pad 106 and the one or more electrical leads 104. Furthermore, the creepage feature 210 may define a first portion 102' of the housing 102 having a first thickness $T_1$, and the thermal pad 106 may define a second portion 102" of the housing 102 having a second thickness $T_2$; the second thickness $T_2$ may be larger than the first thickness $T_1$. As such, the creepage feature 210 may define the step structure 214 in the housing 102.

Figure 6:
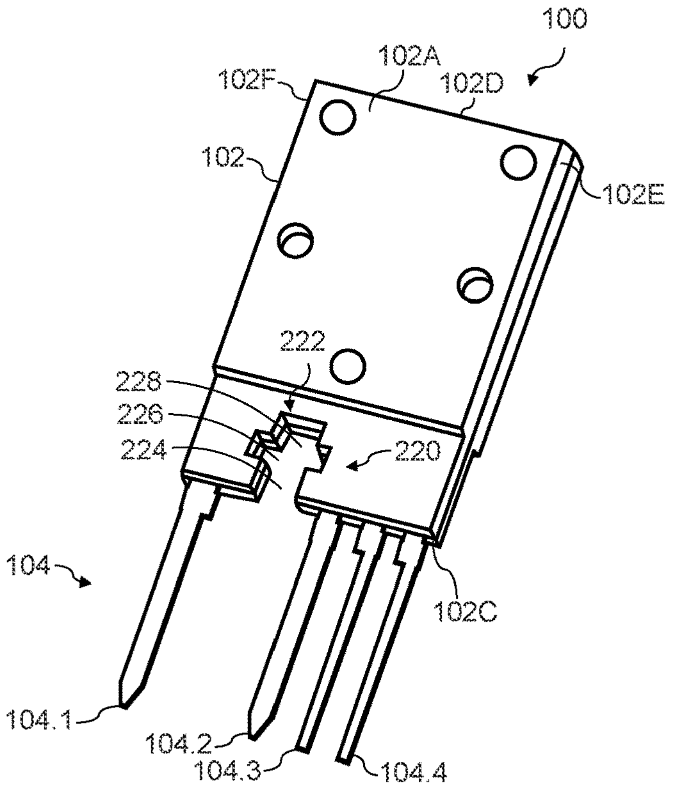
FIG. 6 depicts a top perspective view of an example power semiconductor package according to example embodiments of the present disclosure.
Figure 7:
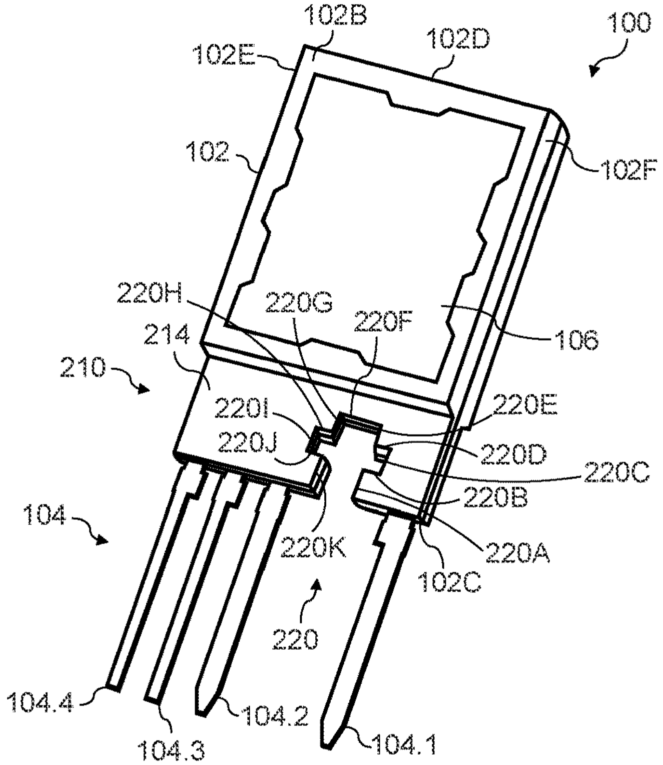
FIG. 7 depicts a bottom perspective view of the example power semiconductor package of FIG. 6 according to example embodiments of the present disclosure.

As noted above, in some implementations, the power semiconductor package 100 may include a cross-shaped creepage cutout. For instance, FIGS. 6-7 depict the example power semiconductor package 100 discussed above with reference to FIGS. 1-5 with a cross-shaped creepage cutout 220 (rather than the T-shaped creepage cutout 120) according to example embodiments of the present disclosure. More particularly, FIG. 6 depicts a top perspective view of the example power semiconductor package 100 having the creepage cutout 220, and FIG. 7 depicts a bottom perspective view of the example power semiconductor package 100 having the creepage cutout 220. It should be noted that, although depicted with creepage feature 210 (i.e., defining step structure 214), the power semiconductor package 100 depicted in FIGS. 6-7 may also (or alternatively) include the creepage feature 110 (i.e., defining trench 114) discussed above with reference to FIGS. 1-3B without deviating from the scope of the present disclosure.

As noted above, the creepage cutout 220 may be a cross-shaped creepage cutout 220 in the housing 102. The creepage cutout 220 may be disposed between a first lead of the one or more electrical leads 104 (e.g., lead 104.2) and a second lead of the one or more electrical leads 104 (e.g., lead 104.1). The creepage cutout 220 may include at least eleven sidewall segments 220A-220K. In this way, the creepage cutout 220 may provide the creepage distance 222 along surface 102C of the housing 102 (e.g., along sidewall segments 220A-220K between leads 104.1, 104.2). Furthermore, the creepage cutout 220 may include a first cutout portion 224 defined by sidewall segments 220A, 220K. The creepage cutout 220 may also include a second cutout portion 226 defined by sidewall segments 220B, 220C, 220D, 220H, 220I, 220J. The creepage cutout 220 may also include a third cutout portion 228 defined by sidewall segments 220E, 220F, 220G.

More particularly, as shown, the first cutout portion 224 of the creepage cutout 220 may extend from the surface 102C towards a center of the housing 102 (e.g., towards surface 102D), the second cutout portion 226 of the creepage cutout 220 may extend laterally between surface 102E and surface 102F of the housing 102, and the third cutout portion 228 of the creepage cutout 220 may extend from the second cutout portion 226 towards the center of the housing 102 (e.g., towards surface 102D). Put differently, the first cutout portion 224 may extend from the one or more electrical leads 104 on surface 102C towards a center of the second cutout portion 226, and the second cutout portion 226 may extend laterally from a peripheral end of the first cutout portion 224 towards surfaces 102E, 102F. Furthermore, the third cutout portion 228, which may be coplanar with the first cutout portion 224, may extend from a peripheral end of sidewall segments 220D, 220H towards the thermal pad 106. Thus, the second cutout portion 226 may be generally perpendicular to the first cutout portion 224 and the third cutout portion 228. In this manner, as shown, the creepage cutout 220 may increase the shortest direct path (e.g., creepage distance 222) between the lead 104.1 and the lead 104.2.

Figure 8:
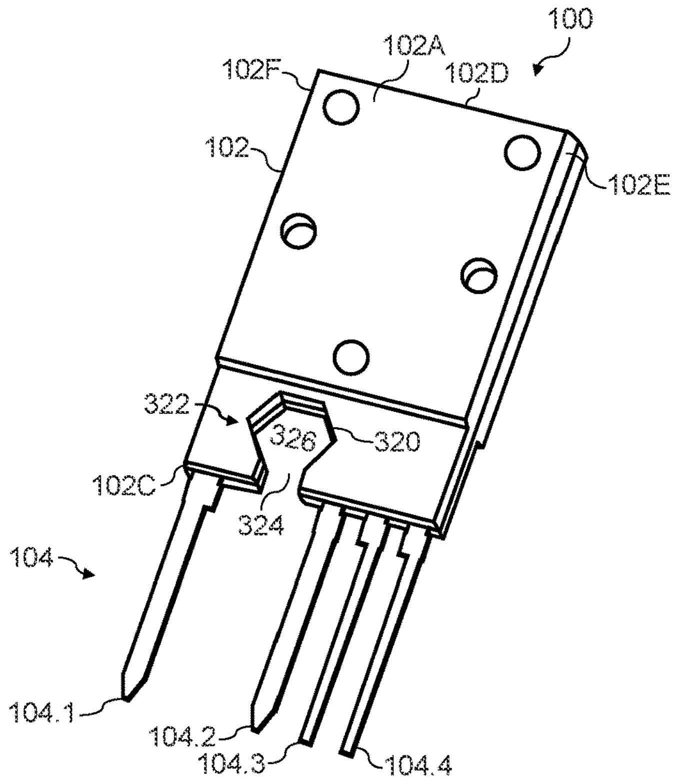
FIG. 8 depicts a top perspective view of an example power semiconductor package according to example embodiments of the present disclosure.
Figure 9:
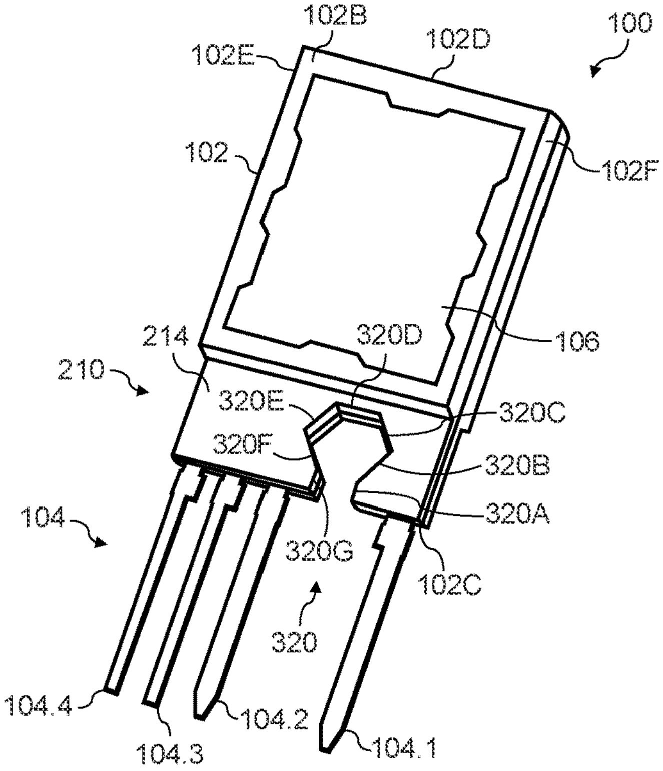
FIG. 9 depicts a bottom perspective view of the example power semiconductor package of FIG. 8 according to example embodiments of the present disclosure.

As noted above, in some implementations, the power semiconductor package 100 may include a hexagonal creepage cutout. For instance, FIGS. 8-9 depict the example power semiconductor package 100 discussed above with reference to FIGS. 1-7 with a hexagonal creepage cutout 320 (rather than the T-shaped creepage cutout 120 (FIGS. 1-5) or the cross-shaped creepage cutout 220 (FIGS. 6-7)) according to example embodiments of the present disclosure. More particularly, FIG. 8 depicts a top perspective view of the example power semiconductor package 100 having the creepage cutout 320, and FIG. 9 depicts a bottom perspective view of the example power semiconductor package 100 having the creepage cutout 320. It should be noted that, although depicted with creepage feature 210 (i.e., defining step structure 214), the power semiconductor package 100 depicted in FIGS. 8-9 may also (or alternatively) include the creepage feature 110 (i.e., defining trench 114) discussed above with reference to FIGS. 1-3B without deviating from the scope of the present disclosure.

As noted above, the creepage cutout 320 may be a hexagonal creepage cutout 320 in the housing 102. The creepage cutout 320 may be disposed between a first lead of the one or more electrical leads 104 (e.g., lead 104.2) and a second lead of the one or more electrical leads 104 (e.g., lead 104.1). The creepage cutout 320 may include at least seven sidewall segments 320A-320G. In this way, the creepage cutout 320 may provide the creepage distance 322 along surface 102C of the housing 102 (e.g., along sidewall segments 320A-320G between leads 104.1, 104.2). Furthermore, the creepage cutout 320 may include a first cutout portion 324 defined by sidewall segments 320A, 320G. The creepage cutout 320 may also include a second cutout portion 326 defined by sidewall segments 320B, 320C, 320D, 320E, 320F. As shown, the second cutout portion 326 may have a generally hexagonal shape.

More particularly, as shown, the first cutout portion 324 of the creepage cutout 320 may extend from the surface 102C towards a center of the housing 102 (e.g., towards surface 102D). The second cutout portion 326 of the creepage cutout 320 may extend laterally between surface 102E and surface 102F of the housing and may also extend vertically from a peripheral end of the first cutout portion 324 towards the center of the housing 102. Put differently, the first cutout portion 324 may extend from the one or more electrical leads 104 on surface 102C towards a center of the second cutout portion 326. The second cutout portion 326 (e.g., sidewall segments 320B, 320F) may extend laterally from a peripheral end of the first cutout portion 324 towards surfaces 102E, 102F at a first oblique angle $\theta_1$. The second cutout portion 326 (e.g., sidewall segments 320C, 320E) may also extend laterally from a peripheral end of sidewall segments 320B, 320F towards sidewall segment 320D at a second oblique angle $\theta_2$. Thus, the second cutout portion 326 may have a generally hexagonal shape. In this manner, as shown, the creepage cutout 320 may increase the shortest direct path (e.g., creepage distance 322) between the lead 104.1 and the lead 104.2.

Figure 10:
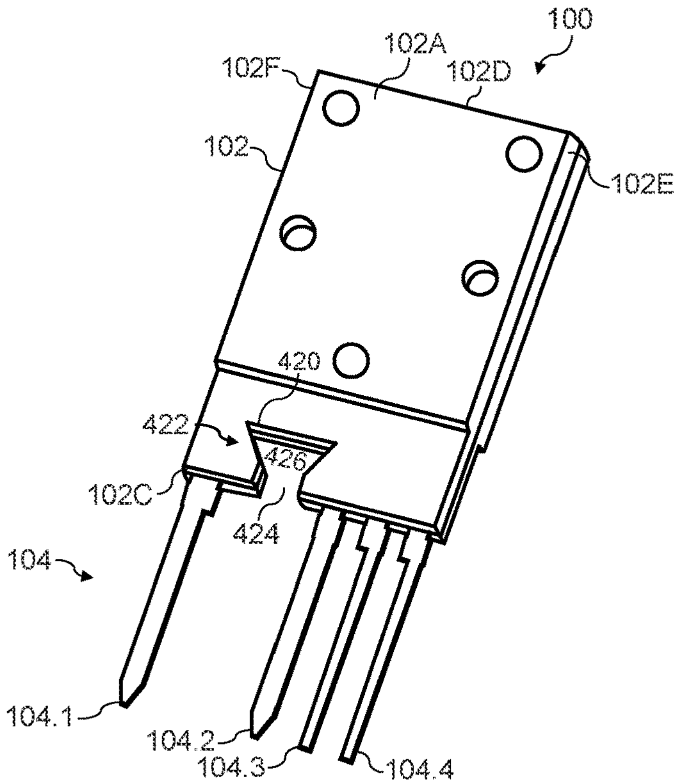
FIG. 10 depicts a top perspective view of an example power semiconductor package according to example embodiments of the present disclosure.
Figure 11:
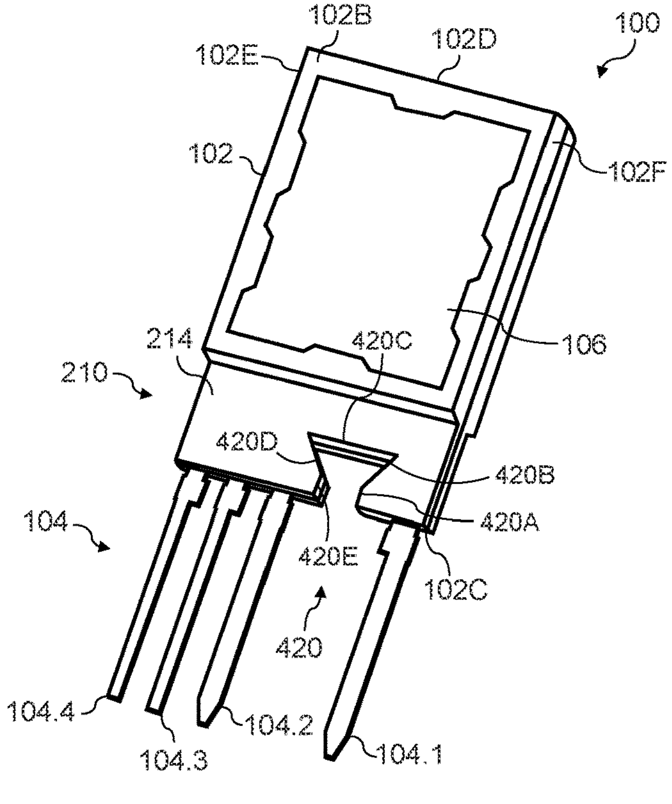
FIG. 11 depicts a bottom perspective view of the example power semiconductor package of FIG. 10 according to example embodiments of the present disclosure.

As noted above, in some implementations, the power semiconductor package 100 may include a triangular creepage cutout having at least two sidewall segments. For instance, FIGS. 10-11 depict the example power semiconductor package 100 discussed above with reference to FIGS. 1-9 with a triangular creepage cutout 420 (rather than the T-shaped creepage cutout 120 (FIGS. 1-5), the cross-shaped creepage cutout 220 (FIGS. 6-7), or the hexagonal creepage cutout 320 (FIGS. 8-9)) according to example embodiments of the present disclosure. More particularly, FIG. 10 depicts a top perspective view of the example power semiconductor package 100 having the creepage cutout 420, and FIG. 10 depicts a bottom perspective view of the example power semiconductor package 100 having the creepage cutout 420. It should be noted that, although depicted with creepage feature 210 (i.e., defining step structure 214), the power semiconductor package 100 depicted in FIGS. 10-11 may also (or alternatively) include the creepage feature 110 (i.e., defining trench 114) discussed above with reference to FIGS. 1-3B without deviating from the scope of the present disclosure.

As noted above, the creepage cutout 420 may be a triangular creepage cutout 420 in the housing 102. The creepage cutout 420 may be disposed between a first lead of the one or more electrical leads 104 (e.g., lead 104.2) and a second lead of the one or more electrical leads 104 (e.g., lead 104.1). The creepage cutout 420 may include at least two sidewall segments, such as sidewall segments 420A-420E. In this way, the creepage cutout 420 may provide the creepage distance 422 along surface 102C of the housing 102 (e.g., along sidewall segments 420A-420E between leads 104.1, 104.2). Furthermore, the creepage cutout 420 may include a first cutout portion 424 defined by sidewall segments 420A, 420E. The creepage cutout 420 may also include a second cutout portion 426 defined by sidewall segments 420B, 420C, 420D. As shown, the second cutout portion 426 may have a generally triangular shape.

More particularly, as shown, the first cutout portion 424 of the creepage cutout 420 may extend from the surface 102C towards a center of the housing 102 (e.g., towards surface 102D). The second cutout portion 426 of the creepage cutout 420 may extend laterally between surface 102E and surface 102F of the housing and may also extend vertically from a peripheral end of the first cutout portion 424 towards the center of the housing 102. Put differently, the first cutout portion 424 may extend from the one or more electrical leads 104 on surface 102C towards a center of the second cutout portion 426. The second cutout portion 426 (e.g., sidewall segments 420B, 420D) may extend laterally from a peripheral end of the first cutout portion 424 towards surfaces 102E, 102F (and sidewall segment 420C) at an oblique angle $\theta_1$. Thus, the second cutout portion 426 may have a generally triangular shape. In this manner, as shown, the creepage cutout 420 may increase the shortest direct path (e.g., creepage distance 422) between the lead 104.1 and the lead 104.2.

Figure 12:
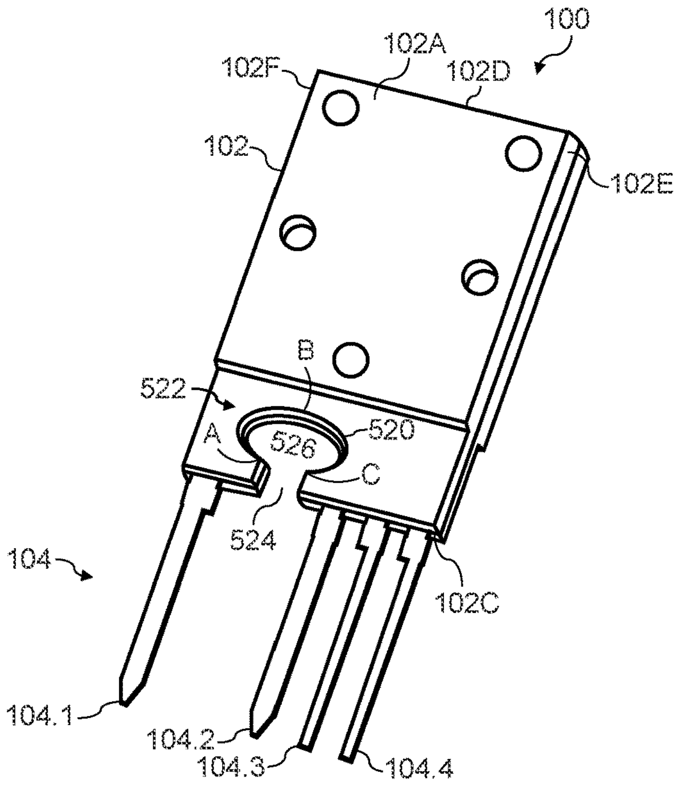
FIG. 12 depicts a top perspective view of an example power semiconductor package according to example embodiments of the present disclosure.
Figure 13:
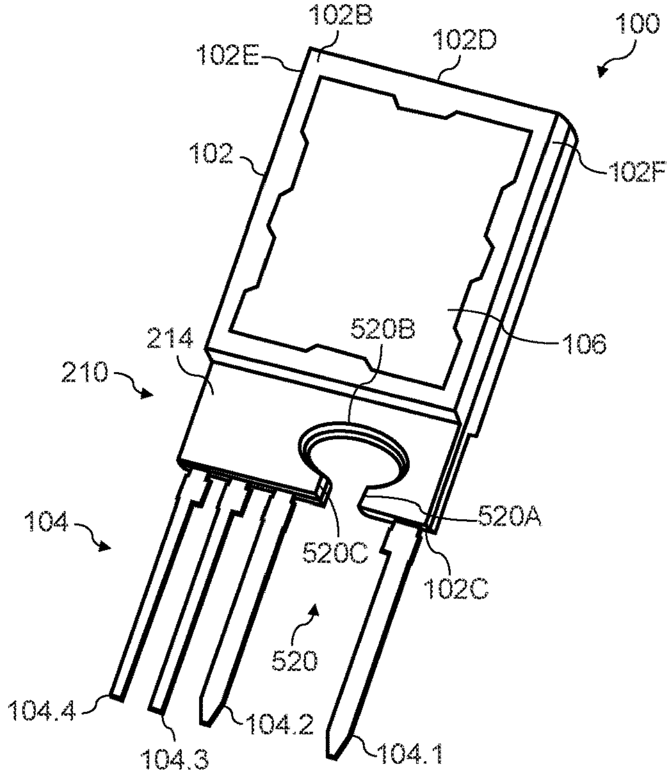
FIG. 13 depicts a bottom perspective view of the example power semiconductor package of FIG. 12 according to example embodiments of the present disclosure.

As noted above, in some implementations, the power semiconductor package 100 may include a circular creepage cutout having at least one sidewall segment. For instance, FIGS. 12-13 depict the example power semiconductor package 100 discussed above with reference to FIGS. 1-11 with a circular creepage cutout 520 (rather than the T-shaped creepage cutout 120 (FIGS. 1-5), the cross-shaped creepage cutout 220 (FIGS. 6-7), the hexagonal creepage cutout 320 (FIGS. 8-9), or the triangular creepage cutout 420 (FIGS. 10-11)) according to example embodiments of the present disclosure. More particularly, FIG. 12 depicts a top perspective view of the example power semiconductor package 100 having the creepage cutout 520, and FIG. 10 depicts a bottom perspective view of the example power semiconductor package 100 having the creepage cutout 520. It should be noted that, although depicted with creepage feature 210 (i.e., defining step structure 214), the power semiconductor package 100 depicted in FIGS. 10-11 may also (or alternatively) include the creepage feature 110 (i.e., defining trench 114) discussed above with reference to FIGS. 1-3B without deviating from the scope of the present disclosure.

As noted above, the creepage cutout 520 may be a circular creepage cutout 520 in the housing 102. The creepage cutout 520 may be disposed between a first lead of the one or more electrical leads 104 (e.g., lead 104.2) and a second lead of the one or more electrical leads 104 (e.g., lead 104.1). The creepage cutout 520 may include at least one sidewall segment, such as sidewall segments 520A-520C. In this way, the creepage cutout 520 may provide the creepage distance 522 along surface 102C of the housing 102 (e.g., along sidewall segments 520A-520C between leads 104.1, 104.2). Furthermore, the creepage cutout 520 may include a first cutout portion 524 defined by sidewall segments 520A, 520C. The creepage cutout 520 may also include a second cutout portion 526 defined by sidewall segment 520B. As shown, the second cutout portion 526 may have a generally circular shape.

More particularly, as shown, the first cutout portion 524 of the creepage cutout 520 may extend from the surface 102C towards a center of the housing 102 (e.g., towards surface 102D). The second cutout portion 526 of the creepage cutout 520 may extend laterally between surface 102E and surface 102F of the housing and may also extend vertically from a peripheral end of the first cutout portion 524 towards the center of the housing 102. Put differently, the first cutout portion 524 may extend from the one or more electrical leads 104 on surface 102C towards a center of the second cutout portion 526. The second cutout portion 526 may extend laterally from a peripheral end of the first cutout portion 524 towards surfaces 102E, 102F and may also extend vertically from the peripheral end of the first cutout portion 524 towards the center of the housing 102. Hence, the second cutout portion 526 may define a circle with a major arc ABC, where point A corresponds to the peripheral end of sidewall segment 520A, point B corresponds to a center of sidewall segment 520B, and point C corresponds to the peripheral end of sidewall segment 520C. Thus, the second cutout portion 526 may have a generally circular shape. In this manner, as shown, the creepage cutout 520 may increase the shortest direct path (e.g., creepage distance 522) between the lead 104.1 and the lead 104.2.

Figure 14:
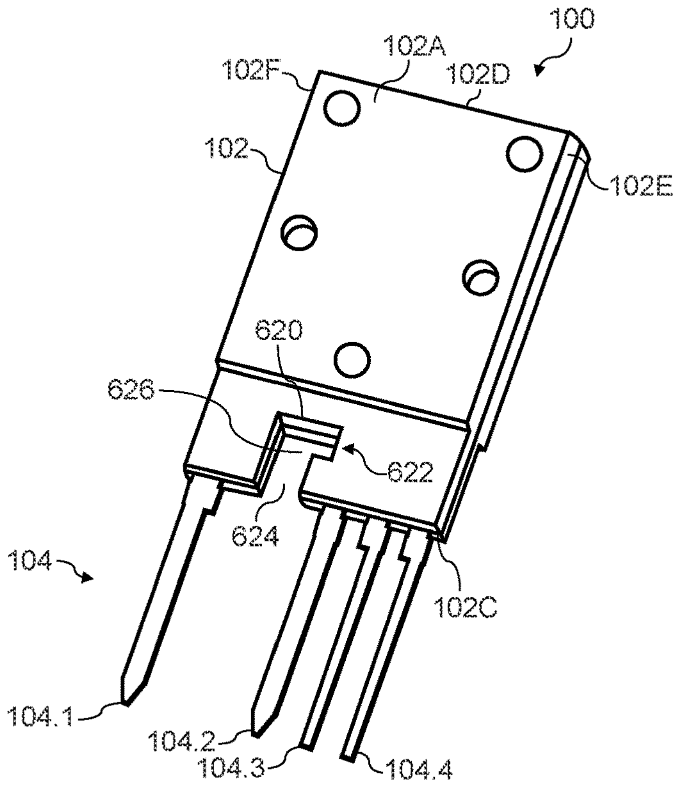
FIG. 14 depicts a top perspective view of an example power semiconductor package according to example embodiments of the present disclosure.
Figure 15:
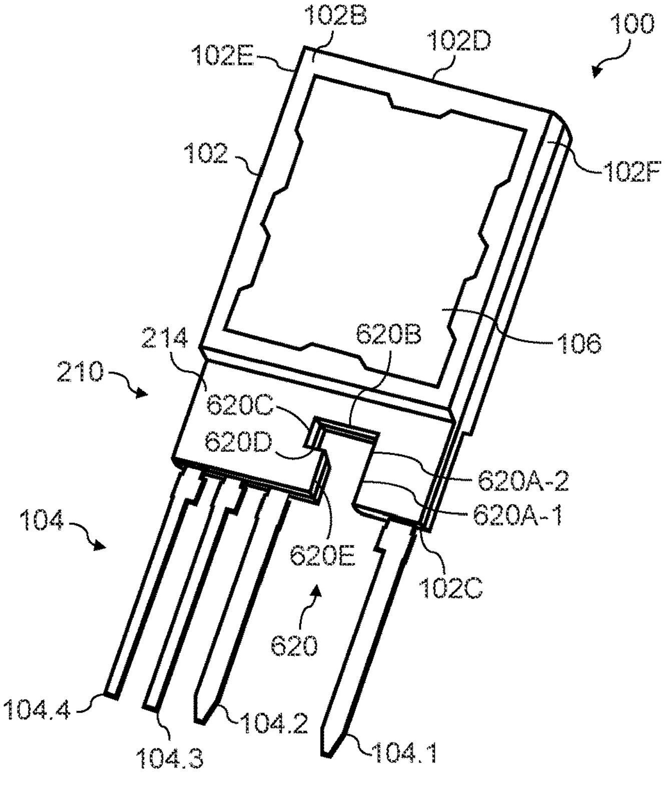
FIG. 15 depicts a bottom perspective view of the example power semiconductor package of FIG. 14 according to example embodiments of the present disclosure.

As noted above, in some implementations, the power semiconductor package 100 may include an L-shaped creepage cutout having at least five sidewall segments. For instance, FIGS. 14-15 depict the example power semiconductor package 100 discussed above with reference to FIGS. 1-13 with an L-shaped creepage cutout 620 (rather than the T-shaped creepage cutout 120 (FIGS. 1-5), the cross-shaped creepage cutout 220 (FIGS. 6-7), the hexagonal creepage cutout 320 (FIGS. 8-9), the triangular creepage cutout 420 (FIGS. 10-11), or the circular creepage cutout 520 (FIGS. 12-13)) according to example embodiments of the present disclosure. More particularly, FIG. 14 depicts a top perspective view of the example power semiconductor package 100 having the creepage cutout 620, and FIG. 15 depicts a bottom perspective view of the example power semiconductor package 100 having the creepage cutout 620. It should be noted that, although depicted with creepage feature 210 (i.e., defining step structure 214), the power semiconductor package 100 depicted in FIGS. 14-15 may also (or alternatively) include the creepage feature 110 (i.e., defining trench 114) discussed above with reference to FIGS. 1-3B without deviating from the scope of the present disclosure.

As noted above, the creepage cutout 620 may be an L-shaped creepage cutout 620 in the housing 102. The creepage cutout 620 may be disposed between a first lead of the one or more electrical leads 104 (e.g., lead 104.2) and a second lead of the one or more electrical leads 104 (e.g., lead 104.1). The creepage cutout 620 may include at least five sidewall segments, such as sidewall segments 620A-620E. In this way, the creepage cutout 620 may provide the creepage distance 622 along surface 102C of the housing 102 (e.g., along sidewall segments 620A-620E between leads 104.1, 104.2). Furthermore, the creepage cutout 620 may include a first cutout portion 624 defined by a first portion of sidewall segment 620A (i.e., sidewall segment 620A-1) and sidewall segment 620E. The creepage cutout 620 may also include a second cutout portion 626 defined by a second portion of sidewall segment 620A (i.e., sidewall segment 620A-2) and sidewall segments 620B, 620C, 620D. As shown, the creepage cutout 620 may be a generally L-shaped creepage cutout.

More particularly, as shown, the first cutout portion 624 of the creepage cutout 620 may extend from the surface 102C towards a center of the housing 102 (e.g., towards surface 102D), and the second cutout portion 626 of the creepage cutout 620 may extend laterally towards surface 102E of the housing 102. Put differently, the first cutout portion 624 may extend from the one or more electrical leads 104 on surface 102C towards a peripheral end of the second cutout portion 626, and the second cutout portion 626 may extend laterally from a peripheral end of the first cutout portion 624 towards surface 102E of the housing 102. Thus, the second cutout portion 626 may be generally perpendicular to the first cutout portion 624. In this manner, as shown, the creepage cutout 620 may increase the shortest direct path (e.g., creepage distance 622) between the lead 104.1 and the lead 104.2.

It should be noted that, although depicted in FIGS. 14-15 as extending laterally towards surface 102E, the second cutout portion 626 may, in some implementations, extend laterally toward surface 102F of the housing 102.

Figure 16:
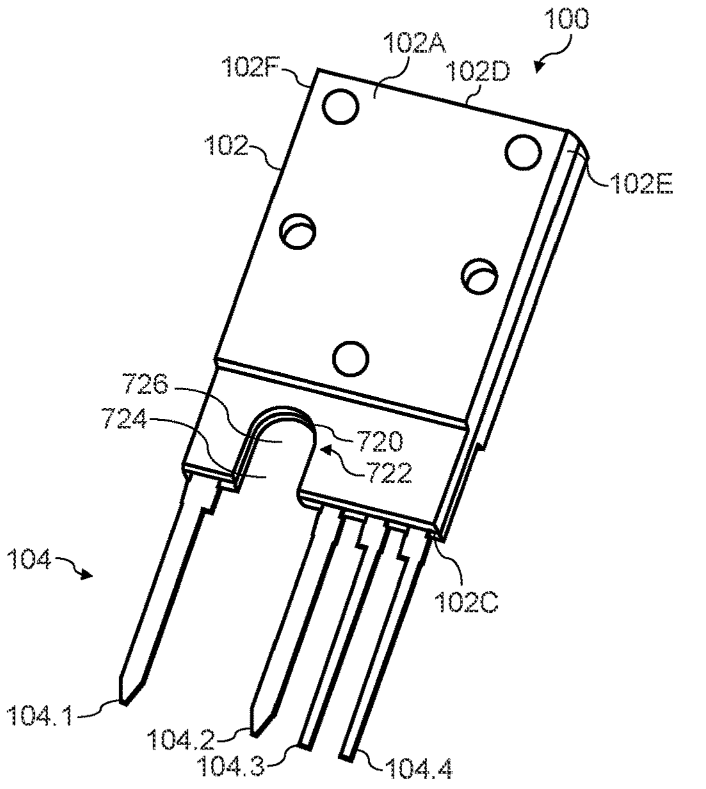
FIG. 16 depicts a top perspective view of an example power semiconductor package according to example embodiments of the present disclosure.
Figure 17:
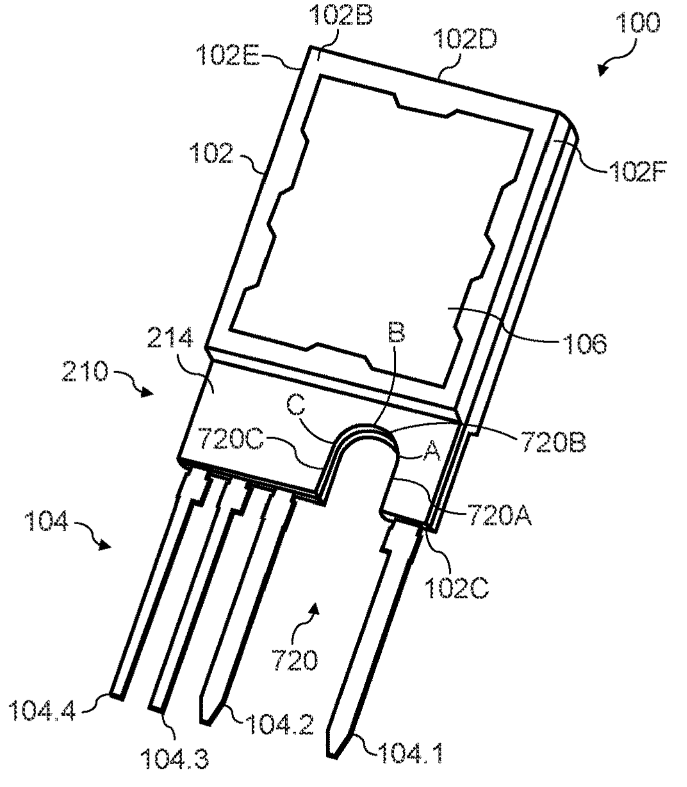
FIG. 17 depicts a bottom perspective view of the example power semiconductor package of FIG. 16 according to example embodiments of the present disclosure.

As noted above, in some implementations, the power semiconductor package 100 may include a curved creepage cutout having at least one sidewall segment. For instance, FIGS. 16-17 depict the example power semiconductor package 100 discussed above with reference to FIGS. 1-15 with a curved creepage cutout 720 (rather than the T-shaped creepage cutout 120 (FIGS. 1-5), the cross-shaped creepage cutout 220 (FIGS. 6-7), the hexagonal creepage cutout 320 (FIGS. 8-9), the triangular creepage cutout 420 (FIGS. 10-11), the circular creepage cutout 520 (FIGS. 12-13), or the L-shaped creepage cutout 620 (FIGS. 14-15)) according to example embodiments of the present disclosure. More particularly, FIG. 16 depicts a top perspective view of the example power semiconductor package 100 having the creepage cutout 720, and FIG. 17 depicts a bottom perspective view of the example power semiconductor package 100 having the creepage cutout 720. It should be noted that, although depicted with creepage feature 210 (i.e., defining step structure 214), the power semiconductor package 100 depicted in FIGS. 16-17 may also (or alternatively) include the creepage feature 110 (i.e., defining trench 114) discussed above with reference to FIGS. 1-3B without deviating from the scope of the present disclosure.

As noted above, the creepage cutout 720 may be a curved creepage cutout 720 in the housing 102. The creepage cutout 720 may be disposed between a first lead of the one or more electrical leads 104 (e.g., lead 104.2) and a second lead of the one or more electrical leads 104 (e.g., lead 104.1). The creepage cutout 720 may include at least one sidewall segment, such as sidewall segments 720A, 720C. The creepage cutout 720 may also include at least one curved sidewall segment, such as sidewall segment 720B. In this way, the creepage cutout 720 may provide the creepage distance 722 along surface 102C of the housing 102 (e.g., along sidewall segments 720A-720C between leads 104.1, 104.2). Furthermore, the creepage cutout 720 may include a first cutout portion 724 defined by sidewall segments 720A, 720C. The creepage cutout 720 may also include a second (e.g., curved) cutout portion 726 defined by sidewall segment 720B. As shown, the second cutout portion 726 may have a generally semi-circular shape. Thus, the creepage cutout 720 may be a generally curved (e.g., arched) creepage cutout.

More particularly, as shown, the first cutout portion 724 of the creepage cutout 720 may extend from the surface 102C towards a center of the housing 102 (e.g., towards surface 102D). The second cutout portion 726 of the creepage cutout 720 may also extend towards the center of the housing 102 (e.g., towards surface 102D) from the first cutout portion 724. Put differently, the first cutout portion 724 may extend from the one or more electrical leads 104 on surface 102C towards a peripheral bottom end of the second cutout portion 726. The second cutout portion 726, which has a generally semi-circular shape, may extend from the peripheral ends of sidewall segments 720A, 720C towards the center of the housing 102. Hence, the second cutout portion 726 may define a curve (e.g., semi-circle) with an arc ABC, where point A corresponds to the peripheral end of sidewall segment 720A, point B corresponds to a center of sidewall segment 720B, and point C corresponds to the peripheral end of sidewall segment 720C. Thus, the second cutout portion 726 may have a generally curved (e.g., semi-circular) shape. In this manner, as shown, the creepage cutout 720 may increase the shortest direct path (e.g., creepage distance 722) between the lead 104.1 and the lead 104.2.

Example aspects of the present disclosure are set forth below. Any of the below features or examples may be used in combination with any of the embodiments or features provided in the present disclosure.

One example embodiment of the present disclosure is directed to a power semiconductor package. The power semiconductor package includes one or more semiconductor die comprising a wide bandgap semiconductor material, a housing, one or more electrical leads extending from the housing, and a non-rectangular creepage cutout in the housing.

In some examples, a first lead of the one or more electrical leads is connected to a source contact of the one or more semiconductor die and a second lead of the one or more electrical leads is connected to a drain contact of the one or more semiconductor die.

In some examples, the creepage cutout is between the first lead and the second lead.

In some examples, the creepage cutout provides a creepage distance between the first lead and the second lead. In some examples, the creepage cutout provides a creepage distance in a range of about 10 mm to about 15 mm.

In some examples, the power semiconductor package further includes a thermal pad that is electrically isolated from the one or more electrical leads.

In some examples, the power semiconductor package further includes a creepage feature between the thermal pad and the one or more electrical leads.

In some examples, the creepage feature defines a step structure in the housing.

In some examples, the creepage feature defines a trench in the housing.

In some examples, the creepage cutout is on a first surface of the housing, the creepage feature is on a second surface of the housing that is adjacent to the first surface, and the thermal pad is on the second surface.

In some examples, the thermal pad is electrically isolated from the one or more semiconductor die.

In some examples, the thermal pad is on an insulating layer of a mounting substrate of the one or more semiconductor die.

In some examples, the thermal pad is coupled to a drain contact of the one or more semiconductor die.

In some examples, the creepage cutout is a T-shaped creepage cutout between a first lead of the one or more electrical leads and a second lead of the one or more electrical leads. In some examples, the T-shaped creepage cutout comprises seven sidewall segments.

In some examples, the creepage cutout is a cross-shaped creepage cutout between a first lead of the one or more electrical leads and a second lead of the one or more electrical leads. In some examples, the cross-shaped creepage cutout comprises eleven sidewall segments.

In some examples, the creepage cutout is a hexagonal creepage cutout between a first lead of the one or more electrical leads and a second lead of the one or more electrical leads. In some examples, the hexagonal creepage cutout comprises seven sidewall segments.

In some examples, the creepage cutout is a triangular creepage cutout between a first lead of the one or more electrical leads and a second lead of the one or more electrical leads. In some examples, the triangular creepage cutout comprises at least two sidewall segments.

In some examples, the creepage cutout is a circular creepage cutout between a first lead of the one or more electrical leads and a second lead of the one or more electrical leads. In some examples, the circular creepage cutout comprises one sidewall segment.

In some examples, the creepage cutout is an L-shaped creepage cutout between a first lead of the one or more electrical leads and a second lead of the one or more electrical leads. In some examples, the L-shaped creepage cutout comprises at least five sidewall segments.

In some examples, the creepage cutout is a curved creepage cutout between a first lead of the one or more electrical leads and a second lead of the one or more electrical leads. In some examples, the curved creepage cutout comprises at least one curved sidewall segment.

In some examples, the creepage cutout is on a first surface of the housing. The housing further includes a second surface and an opposing third surface that are generally perpendicular to the first surface. Furthermore, the creepage cutout includes a first cutout portion that is defined by at least two sidewall segments and a second cutout portion defined by at least three sidewall segments. The first cutout portion extends from the first surface towards a center of the housing, and the second cutout portion extends laterally between the second surface and the third surface.

In some examples, the second cutout portion is generally perpendicular to the first cutout portion.

In some examples, the first cutout portion extends from the one or more electrical leads to a center of the second cutout portion.

In some examples, the second cutout portion extends laterally from a peripheral end of the first cutout portion towards the second surface.

In some examples, the second cutout portion extends laterally from a peripheral end of the first cutout portion towards the third surface.

In some examples, the one or more semiconductor die are disposed within the housing.

In some examples, the wide bandgap semiconductor material comprises silicon carbide or a Group-III nitride.

In some examples, the one or more semiconductor die comprise a metal-oxide-semiconductor field-effect transistor (MOSFET). A first lead of the one or more electrical leads is connected to a gate contact of the MOSFET, and a second lead of the one or more electrical leads is connected to a source contact of the MOSFET. In some examples, a third lead of the one or more electrical leads is connected to a source-kelvin contact of the MOSFET or a sensor contact of the MOSFET. In some examples, the MOSFET is a silicon carbide-based MOSFET.

In some examples, the one or more semiconductor die comprise a Schottky diode. A first lead of the one or more electrical leads is connected to a first contact of the Schottky diode, and a second lead of the one or more electrical leads is connected to a second contact of the Schottky diode. In some examples, the Schottky diode is a silicon carbide-based Schottky diode.

In some examples, the one or more semiconductor die comprise a high electron mobility transistor (HEMT). In some examples, the HEMT is a Group-III nitride-based HEMT.

In some examples, the housing comprises an epoxy mold compound (EMC).

In some examples, the creepage cutout comprises at least five sidewall segments.

In some examples, the creepage cutout comprises at least six sidewall segments.

Another example embodiment of the present disclosure is directed to a power semiconductor package. The power semiconductor package includes one or more semiconductor die comprising a wide bandgap semiconductor material, a housing, one or more electrical leads extending from the housing, and a creepage cutout in the housing comprising at least four sidewall segments.

In some examples, a first lead of the one or more electrical leads is connected to a source contact of the one or more semiconductor die, and a second lead of the one or more electrical leads is connected to a drain contact of the one or more semiconductor die.

In some examples, the creepage cutout is between the first lead and the second lead.

In some examples, the creepage cutout provides a creepage distance between the first lead and the second lead. In some examples, the creepage cutout provides a creepage distance in a range of about 10 mm to about 15 mm.

In some examples, the power semiconductor package further includes a thermal pad that is electrically isolated from the one or more electrical leads.

In some examples, the power semiconductor package further includes a creepage feature between the thermal pad and the one or more electrical leads.

In some examples, the creepage feature defines a step structure in the housing.

In some examples, the creepage feature defines a trench in the housing.

In some examples, the creepage cutout is on a first surface of the housing, the creepage feature is on a second surface of the housing that is adjacent to the first surface, and the thermal pad is on the second surface.

In some examples, the thermal pad is electrically isolated from the one or more semiconductor die.

In some examples, the thermal pad is on an insulating layer of a mounting substrate of the one or more semiconductor die.

In some examples, the thermal pad is coupled to a drain contact of the one or more semiconductor die.

In some examples, the creepage cutout is a T-shaped creepage cutout between a first lead of the one or more electrical leads and a second lead of the one or more electrical leads. In some examples, the T-shaped creepage cutout comprises seven sidewall segments.

In some examples, the creepage cutout is a cross-shaped creepage cutout between a first lead of the one or more electrical leads and a second lead of the one or more electrical leads. In some examples, the cross-shaped creepage cutout comprises eleven sidewall segments.

In some examples, the creepage cutout is a hexagonal creepage cutout between a first lead of the one or more electrical leads and a second lead of the one or more electrical leads. In some examples, the hexagonal creepage cutout comprises seven sidewall segments.

In some examples, the creepage cutout is a triangular creepage cutout between a first lead of the one or more electrical leads and a second lead of the one or more electrical leads. In some examples, the triangular creepage cutout comprises at least two sidewall segments.

In some examples, the creepage cutout is a circular creepage cutout between a first lead of the one or more electrical leads and a second lead of the one or more electrical leads. In some examples, the circular creepage cutout comprises one sidewall segment.

In some examples, the creepage cutout is an L-shaped creepage cutout between a first lead of the one or more electrical leads and a second lead of the one or more electrical leads. In some examples, the L-shaped creepage cutout comprises at least five sidewall segments.

In some examples, the creepage cutout is a curved creepage cutout between a first lead of the one or more electrical leads and a second lead of the one or more electrical leads. In some examples, the curved creepage cutout comprises at least one curved sidewall segment.

In some examples, the creepage cutout is on a first surface of the housing. The housing further includes a second surface and an opposing third surface that are generally perpendicular to the first surface. Furthermore, the creepage cutout includes a first cutout portion defined by at least two sidewall segments and a second cutout portion defined by at least three sidewall segments. The first cutout portion extends from the first surface towards a center of the housing, and the second cutout portion extends laterally between the second surface and the third surface.

In some examples, the second cutout portion is generally perpendicular to the first cutout portion.

In some examples, the first cutout portion extends from the one or more electrical leads to a center of the second cutout portion.

In some examples, the second cutout portion extends laterally from a peripheral end of the first cutout portion towards the second surface.

In some examples, the second cutout portion extends laterally from a peripheral end of the first cutout portion towards the third surface.

In some examples, the one or more semiconductor die are disposed within the housing.

In some examples, the wide bandgap semiconductor material comprises silicon carbide or a Group-III nitride.

In some examples, the one or more semiconductor die comprise a metal-oxide-semiconductor field-effect transistor (MOSFET). A first lead of the one or more electrical leads is connected to a gate contact of the MOSFET, and a second lead of the one or more electrical leads is connected to a source contact of the MOSFET. In some examples, a third lead of the one or more electrical leads is connected to a source-kelvin contact of the MOSFET or a sensor contact of the MOSFET. In some examples, the MOSFET is a silicon carbide-based MOSFET.

In some examples, the one or more semiconductor die comprise a Schottky diode. A first lead of the one or more electrical leads is connected to a first contact of the Schottky diode, and a second lead of the one or more electrical leads is connected to a second contact of the Schottky diode. In some examples, the Schottky diode is a silicon carbide-based Schottky diode.

In some examples, the one or more semiconductor die comprise a high electron mobility transistor (HEMT). In some examples, the HEMT is a Group-III nitride-based HEMT.

In some examples, the housing comprises an epoxy mold compound (EMC).

In some examples, the creepage cutout comprises at least five sidewall segments.

In some examples, the creepage cutout comprises at least six sidewall segments.

Another example embodiment of the present disclosure is directed to a power semiconductor package. The power semiconductor package includes one or more semiconductor die comprising a wide bandgap semiconductor material, a housing, one or more electrical leads extending from the housing, a thermal pad that is electrically isolated from the one or more electrical leads, a creepage cutout, and a creepage feature comprising a trench.

In some examples, the trench has a depth of about 0.5 mm to about 2.0 mm.

In some examples, a first lead of the one or more electrical leads is connected to a source contact of the one or more semiconductor die, and a second lead of the one or more electrical leads is connected to a drain contact of the one or more semiconductor die.

In some examples, the creepage cutout is between the first lead and the second lead.

In some examples, the creepage cutout provides a creepage distance between the first lead and the second lead. In some examples, the creepage cutout provides a creepage distance in a range of about 10 mm to about 15 mm.

In some examples, the creepage feature is between the thermal pad and the one or more electrical leads.

In some examples, the thermal pad is on a surface of the housing.

In some examples, the creepage feature provides a creepage distance in a range of about 10 mm to about 15 mm.

In some examples, the thermal pad is electrically isolated from the one or more semiconductor die.

In some examples, the thermal pad is on an insulating layer of a mounting substrate of the one or more semiconductor die.

In some examples, the thermal pad is coupled to a drain contact of the one or more semiconductor die.

In some examples, the creepage cutout is a T-shaped creepage cutout between a first lead of the one or more electrical leads and a second lead of the one or more electrical leads. In some examples, the T-shaped creepage cutout comprises seven sidewall segments.

In some examples, the creepage cutout is a cross-shaped creepage cutout between a first lead of the one or more electrical leads and a second lead of the one or more electrical leads. In some examples, the cross-shaped creepage cutout comprises eleven sidewall segments.

In some examples, the creepage cutout is a hexagonal creepage cutout between a first lead of the one or more electrical leads and a second lead of the one or more electrical leads. In some examples, the hexagonal creepage cutout comprises seven sidewall segments.

In some examples, the creepage cutout is a triangular creepage cutout between a first lead of the one or more electrical leads and a second lead of the one or more electrical leads. In some examples, the triangular creepage cutout comprises at least two sidewall segments.

In some examples, the creepage cutout is a circular creepage cutout between a first lead of the one or more electrical leads and a second lead of the one or more electrical leads. In some examples, the circular creepage cutout comprises one sidewall segment.

In some examples, the creepage cutout is an L-shaped creepage cutout between a first lead of the one or more electrical leads and a second lead of the one or more electrical leads. In some examples, the L-shaped creepage cutout comprises at least five sidewall segments.

In some examples, the creepage cutout is a curved creepage cutout between a first lead of the one or more electrical leads and a second lead of the one or more electrical leads. In some examples, the curved creepage cutout comprises at least one curved sidewall segment.

In some examples, the creepage cutout is on a first surface of the housing and the creepage feature is on a second surface of the housing, and the housing further comprises a third surface and an opposing fourth surface. The third surface and the fourth surface laterally bound the second surface. Furthermore, the creepage cutout includes a first cutout portion defined by at least two sidewall segments, and a second cutout portion defined by at least three sidewall segments. The first cutout portion extends from the first surface towards a center of the housing, and the second cutout portion extends laterally between the third surface and the fourth surface.

In some examples, the second cutout portion is generally perpendicular to the first cutout portion.

In some examples, the first cutout portion extends from the one or more electrical leads to a center of the second cutout portion.

In some examples, the second cutout portion extends laterally from a peripheral end of the first cutout portion towards the second surface.

In some examples, the second cutout portion extends laterally from a peripheral end of the first cutout portion towards the third surface.

In some examples, the one or more semiconductor die are disposed within the housing.

In some examples, the wide bandgap semiconductor material comprises silicon carbide or a Group-III nitride.

In some examples, the one or more semiconductor die comprise a metal-oxide-semiconductor field-effect transistor (MOSFET). A first lead of the one or more electrical leads is connected to a gate contact of the MOSFET, and a second lead of the one or more electrical leads is connected to a source contact of the MOSFET. In some examples, a third lead of the one or more electrical leads is connected to a source-kelvin contact of the MOSFET or a sensor contact of the MOSFET. In some examples, the MOSFET is a silicon carbide-based MOSFET.

In some examples, the one or more semiconductor die comprise a Schottky diode. A first lead of the one or more electrical leads is connected to a first contact of the Schottky diode, and a second lead of the one or more electrical leads is connected to a second contact of the Schottky diode. In some examples, the Schottky diode is a silicon carbide-based Schottky diode.

In some examples, the one or more semiconductor die comprise a high electron mobility transistor (HEMT). In some examples, the HEMT is a Group-III nitride-based HEMT.

In some examples, the housing comprises an epoxy mold compound (EMC).

In some examples, the creepage cutout comprises at least five sidewall segments.

In some examples, the creepage cutout comprises at least six sidewall segments.

Another example embodiment of the present disclosure is directed to a power semiconductor package. The power semiconductor package includes one or more semiconductor die comprising a wide bandgap semiconductor material, a housing, one or more electrical leads extending from the housing, and a creepage cutout in the housing. The creepage cutout is one of a T-shaped creepage cutout, a cross-shaped creepage cutout, a hexagonal creepage cutout, a triangular creepage cutout, a circular creepage cutout, an L-shaped creepage cutout, or a curved creepage cutout.

While the present subject matter has been described in detail with respect to specific example embodiments thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A power semiconductor package, comprising:

one or more semiconductor die comprising a wide bandgap semiconductor material;

a housing;

one or more electrical leads extending from the housing; and a non-rectangular creepage cutout in the housing, the non-rectangular creepage cutout comprising at least five sidewall segments.

2. The power semiconductor package of claim 1, wherein a first lead of the one or more electrical leads is connected to a source contact of the one or more semiconductor die and a second lead of the one or more electrical leads is connected to a drain contact of the one or more semiconductor die.

3. The power semiconductor package of claim 1, further comprising a thermal pad that is electrically isolated from the one or more electrical leads and a creepage feature between the thermal pad and the one or more electrical leads.

4. The power semiconductor package of claim 3, wherein the creepage feature defines a step structure in the housing.

5. The power semiconductor package of claim 3, wherein:

the creepage cutout is on a first surface of the housing;

the creepage feature is on a second surface of the housing, the second surface being adjacent to the first surface; and the thermal pad is on the second surface.

6. The power semiconductor package of claim 1, wherein the creepage cutout is a T-shaped creepage cutout between a first lead of the one or more electrical leads and a second lead of the one or more electrical leads.

7. The power semiconductor package of claim 1, wherein the creepage cutout is a cross-shaped creepage cutout between a first lead of the one or more electrical leads and a second lead of the one or more electrical leads.

8. The power semiconductor package of claim 1, wherein the creepage cutout is a hexagonal creepage cutout between a first lead of the one or more electrical leads and a second lead of the one or more electrical leads.

9. The power semiconductor package of claim 1, wherein the creepage cutout is a triangular creepage cutout between a first lead of the one or more electrical leads and a second lead of the one or more electrical leads.

10. The power semiconductor package of claim 1, wherein the creepage cutout is an L-shaped creepage cutout between a first lead of the one or more electrical leads and a second lead of the one or more electrical leads.

11. The power semiconductor package of claim 1, wherein the one or more semiconductor die comprise a metal-oxide-semiconductor field-effect transistor (MOSFET), wherein a first lead of the one or more electrical leads is connected to a gate contact of the MOSFET and a second lead of the one or more electrical leads is connected to a source contact of the MOSFET.

12. A power semiconductor package, comprising:

one or more semiconductor die comprising a wide bandgap semiconductor material;

a housing;

one or more electrical leads extending from the housing;

a thermal pad that is electrically isolated from the one or more electrical leads;

a creepage cutout; and a creepage feature, the creepage feature comprising a step structure, wherein the creepage feature defines a first portion of the housing having a first thickness, and the thermal pad defines a second portion of the housing having a second thickness that is larger than the first thickness.

13. The power semiconductor package of claim 12, wherein the creepage feature is between the thermal pad and the one or more electrical leads.

14. The power semiconductor package of claim 12, wherein the creepage cutout is on a first surface of the housing and the creepage feature is on a second surface of the housing, wherein the housing further comprises a third surface and an opposing fourth surface, the third surface and the fourth surface laterally bounding the second surface, and wherein the creepage cutout comprises:

a first cutout portion defined by at least two sidewall segments, the first cutout portion extending from the first surface towards a center of the housing; and a second cutout portion defined by at least three sidewall segments, the second cutout portion extending laterally between the third surface and the fourth surface.

15. The power semiconductor package of claim 14, wherein the second cutout portion is generally perpendicular to the first cutout portion.

16. The power semiconductor package of claim 14, wherein the first cutout portion extends from the one or more electrical leads to a center of the second cutout portion.

17. The power semiconductor package of claim 14, wherein the second cutout portion extends laterally from a peripheral end of the first cutout portion towards the second surface.

18. A power semiconductor package, comprising:

one or more semiconductor die comprising a wide bandgap semiconductor material;

a housing;

one or more electrical leads extending from the housing; and a creepage cutout in the housing, the creepage cutout comprising one of a T-shaped creepage cutout, a cross-shaped creepage cutout, a hexagonal creepage cutout, a circular creepage cutout, or an L-shaped creepage cutout.

* * * * *